US012162146B2

(12) United States Patent
Hazan et al.

(10) Patent No.: US 12,162,146 B2
(45) Date of Patent: Dec. 10, 2024

(54) METHOD AND SYSTEM FOR FACILITATING A CONCURRENT SIMULATION OF MULTIPLE ROBOTIC TASKS

(71) Applicant: Siemens Industry Software Ltd., Tel Aviv (IL)

(72) Inventors: Moshe Hazan, Elad (IL); Gilad Milman, Hod Hasharon (IL); Ilanit Shavit, Tel Aviv (IL); Gal Snir, Ramat Gan (IL); Gilles Velay, Garancieres (FR)

(73) Assignee: Siemens Industry Software Ltd., Tel Aviv (IL)

( * ) Notice: Subject to any disclaimer, the term of this patent is extended or adjusted under 35 U.S.C. 154(b) by 316 days.

(21) Appl. No.: 17/793,704

(22) PCT Filed: Jan. 20, 2020

(86) PCT No.: PCT/IB2020/050416
§ 371 (c)(1),
(2) Date: Jul. 19, 2022

(87) PCT Pub. No.: WO2021/148839
PCT Pub. Date: Jul. 29, 2021

(65) Prior Publication Data
US 2023/0070378 A1      Mar. 9, 2023

(51) Int. Cl.
*B25J 9/16*       (2006.01)
(52) U.S. Cl.
CPC ... *B25J 9/1605* (2013.01); *G05B 2219/39001* (2013.01)

(58) Field of Classification Search
CPC .......... B25J 9/1671; B25J 9/1605; G05B 2219/39001; G05B 2219/40311;
(Continued)

(56) References Cited

U.S. PATENT DOCUMENTS 6,268,853 B1     7/2001   Hoskins et al.
2002/0120921 A1  8/2002   Coburn et al.
(Continued)

FOREIGN PATENT DOCUMENTS

CN     1647055 A     7/2005
CN     101226385 A   7/2008
(Continued)

*Primary Examiner* — Khoi H Tran
*Assistant Examiner* — Bryant Tang
(74) *Attorney, Agent, or Firm* — Laurence A. Greenberg; Werner H. Stemer; Ralph E. Locher

(57) ABSTRACT

Systems and a method for facilitating a concurrent simulation of multiple tasks of a plurality of robots in a virtual environment, wherein at least one virtual robot is foreseen to concurrently simulate one robotic motion task and a set of robotic logic tasks by concurrently executing one corresponding robotic motion program and a set of corresponding robotic logic programs on a set of operands. During a concurrent execution of the plurality of robotic motion programs and the plurality of sets of robotic logic programs of the plurality of robots, the execution of at least one given logic program is suspended and resumed by repetitively: executing a run of the given logic program; collecting a subset of operands used in the executed run; if none of the collected operands is modified in the execution run, suspending the execution of the given logic program and resuming its execution when one of the collected operands is modified.

9 Claims, 6 Drawing Sheets

(58) Field of Classification Search
CPC ...... G05B 19/41885; G06N 5/04; G06N 3/09; G06N 3/08
See application file for complete search history.

(56) References Cited

U.S. PATENT DOCUMENTS

| | | |
|---|---|---|
| 2003/0090491 A1 | 5/2003 | Watanabe et al. |
| 2005/0033457 A1 | 2/2005 | Yamane |
| 2007/0083285 A1 | 4/2007 | Onishi et al. |
| 2010/0106262 A1* | 4/2010 | Schreyer ............ H04L 12/2814 700/86 |
| 2016/0257000 A1* | 9/2016 | Guerin .................. B25J 9/1671 |
| 2019/0325263 A1 | 10/2019 | Kellerman |

FOREIGN PATENT DOCUMENTS

| | | |
|---|---|---|
| CN | 101606129 A | 12/2009 |
| CN | 107571271 A | 1/2018 |
| CN | 109814478 A * | 5/2019 |
| JP | 2000305803 A * | 11/2000 |

* cited by examiner

FIG 2

/PROG INIT_Markers
/ATTR
OWNER       = dnb5zq;
COMMENT     = " ",
PROG_SIZE   = 0;
CREATE      = DATE 2019-11-26  TIME 15:21:35;
MODIFIED    = DATE 2019-11-26  TIME 15:21:35;
FILE_NAME   = INIT_Markers;
VERSION     = 0;
LINE_COUNT  = 2;
MEMORY_SIZE = 0;
PROTECT     = READ_WRITE;
TCD: STACK_SIZE    = 0,
     TASK_PRIORITY = 50,
     TIME_SLICE    = 0,
     BUSY_LAMP_OFF = 0,
     ABORT_REQUEST = 0,
     PAUSE_REQUEST = 0;
DEFAULT_GROUP = *,*,*,*,*;
CONTROL_CODE  = 00000000 00000000;
/APPL
  SPOT : TRUE;
  SPOT WELDING EQUIPMENT NUMBER : 1;
/MN
  1: M[1] = (DI[21] AND DI[23]);
  2: M[2] = (DI[25] AND DI[27]);
  3: RO[2] = ON;
/POS
/END

201

200

203

202

Robot Program Viewer - Main [r1]

```
 1  /PROG Main
25   1: CALL INIT_IO ;
26   2: ;
27   3: !Wait for task Init IO to finish ;
28   4: ;
29   5: WAIT RO[1] = ON ;
30   6: DO[1] = ON ;
31   7: ;
32   8: !Wait for paralel task Markers to finish
33   9: ;
34  10: WAIT RO[2] = ON;
35  11: DO[2] = ON ;
36  12: ;
37  13: !START OF MAIN LOOP ;
38  14: ;
39  15: LBL[1:StartLoop];
40  16: ;
41  17: CALL PRODUCTION START ;
42  18: ;
43  19: WAIT RO[1] = ON ;
44  20: DO[3] = ON ;
45  21: ;
46  22: !GLOBAL VARS ;
47  23: R[3] = F[1] + F[2] + F[3] + F[4];
48  24: GO[2] = R[3];
49  25: F[5] = (DI[21] AND DI[23]);
50  26: F[6] = (DI[25] AND DI[27]);
51  27: R[4] = F[5] + F[6];
```

FIG 3B

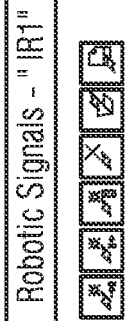

Robotic Signals – "IR1"

| PLC Signal Name | Robot Signal Name | I/O | Signal Function | HW T... |
|---|---|---|---|---|
| IR1_startProgram | startProgram | Q | Starting Program | BOOL |
| IR1_programNumber | programNumber | Q | Program Number | BYTE |
| IR1_emergencyStop | emergencyStop | Q | Program Emergency Stop | BOOL |
| IR1_programPause | programPause | Q | Program Pause | BOOL |
| IR1_programEnded | programEnded | I | Ending Program | BOOL |
| IR1_mirrorProgramNumber | mirrorProgramNumber | I | Mirror Program Number | BYTE |
| IR1_errorProgramNumber | errorProgramNumber | I | Error Program Number | BOOL |
| IR1_robotReady | robotReady | I | Robot Ready | BOOL |
| R1_DI[1] | DI[1] | Q | | BOOL |
| R1_DI[2] | DI[2] | Q | | BOOL |
| R1_DI[3] | DI[3] | Q | | BOOL |
| R1_DO[1] | DO[1] | I | | BOOL |
| R1_DO[2] | DO[2] | I | | BOOL |

302

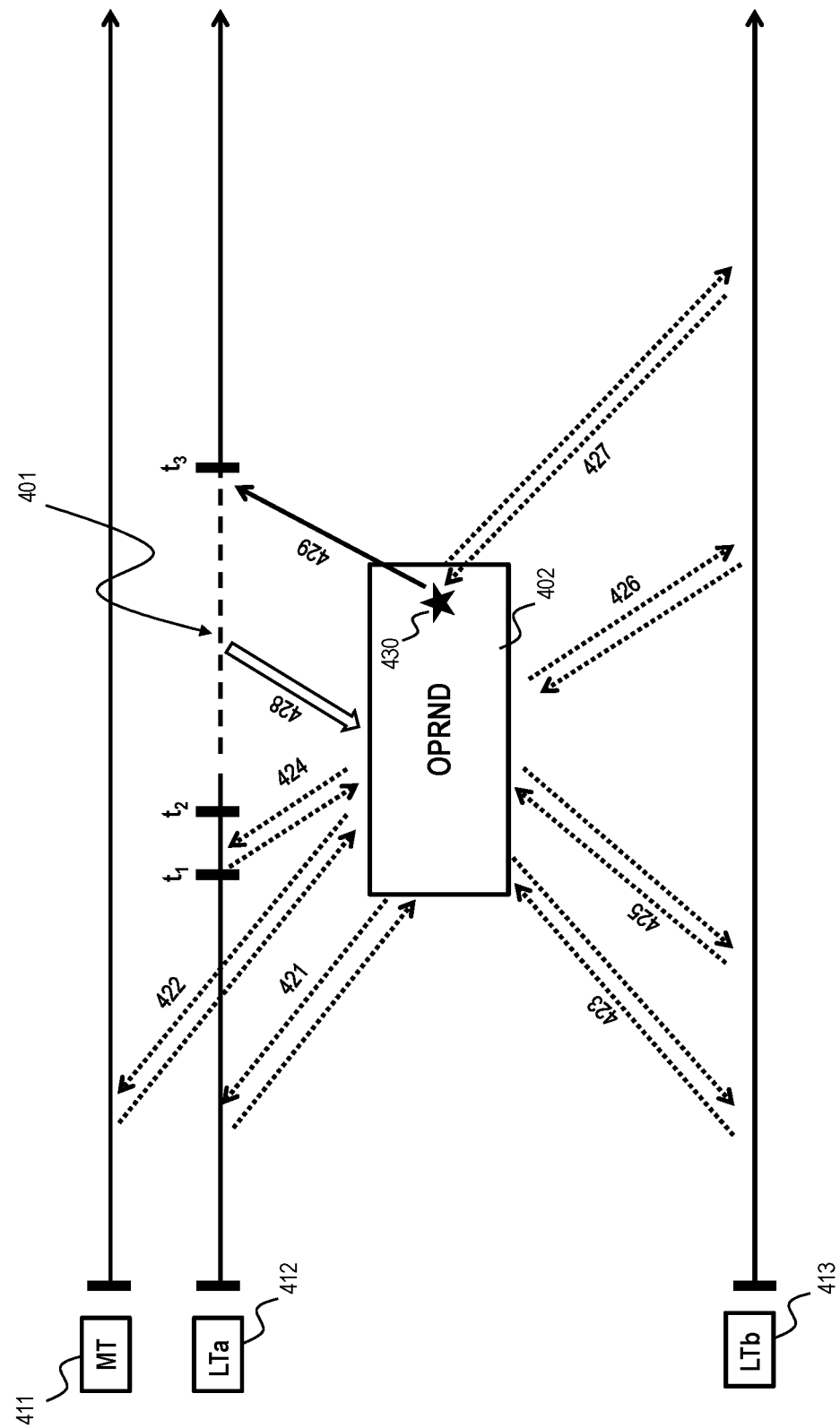

METHOD AND SYSTEM FOR FACILITATING A CONCURRENT SIMULATION OF MULTIPLE ROBOTIC TASKS

TECHNICAL FIELD

The present disclosure is directed, in general, to computer-aided design, visualization, and manufacturing ("CAD") systems, product lifecycle management ("PLM") systems, product data management ("PDM") systems, and similar systems, that manage data for products and other items (collectively, "Product Data Management" systems or PDM systems). More specifically, the disclosure is directed to production environment simulation.

BACKGROUND OF THE DISCLOSURE

In robotic cells of manufacturing facilities, each physical industrial robot is often required to execute multiple tasks in parallel. Such multiple parallel tasks of a single robot usually consist of one single main robotic motion task and several minor robotic logic tasks. As used herein, the term "motion task" denotes the main robotic task which typically comprises a set of kinematic operations and a set of logic operations. As used herein, the term "logic task" denotes a minor robotic logic task comprising a set of logic operations and no kinematic operation.

The multiple different robotic tasks are executed by the physical robots by running, on their own robotic controllers' threads or processes, corresponding robotic programs on a set of operands. The codes of such robotic programs are usually written in a robotic programming language, usually a native language of the specific robot's vendor and model. Examples of such native robotic languages include, but are not limited by, native robotic languages supported by robot's vendors e.g. like Kuka, ABB, Fanuc.

Simulation software applications for industrial robots should preferably fulfil the requirement of enabling the simulation of all different multiple tasks performed by the several physical industrial robots on the shop floor.

This requirement is particularly important for virtual commissioning systems which enable production optimizations and equipment validations.

In order to concurrently simulate all the multiple robotic tasks, a simulating system is required to concurrently execute all the robot programs of all the plurality of robot controllers of a production cell.

Since today's production cells do comprise more and more robots, the capability of simulating a full robotic cell with real time performances becomes a critical one.

The robotic simulation is expected to be as realistic as possible by mirroring the execution of all the robotic tasks of the involved physical robots and by providing high performances in term of execution time by achieving a virtual time as close as possible to the real time.

In fact, for example, having a high performing simulation execution time is important for enabling synchronizations with the PLC running code and for preventing PLC code's exits with "time out" errors.

Hence, a robotic simulation application is required to realistically simulate the multiple robotic tasks of a plurality of robots by executing, in a concurrent and high performing manner, the plurality of main robotic motion programs together with the plurality of sets of robotic logic programs.

For complex industrial cells, having dozens of robots each executing dozens of tasks, this requirement implies running a robotic simulation with high performances for several hundred robotic programs or more.

Nowadays, high performances in simulating such complex robot cells may be achieved by executing hundreds of parallel robotic programs in several CPUs, in clusters of computers or on super computers.

However, today's common scenario is that industrial robotic simulations are mostly executed on computers with common resources rather than on super computers.

Therefore, for cells having a plurality of robots, today's robotic simulations on common computers are typically executed with the help of one or more of the following expedients;

- executing only the robotic motion programs, while ignoring robotic logic programs;
- executing the robotic motion programs, while manually modeling robotic logic tasks by rewriting their logic programs native codes by using logic blocks;
- executing robotic motion programs, while connecting to external Virtual Robot Controllers ("VRCs") able of executing the robotic logic tasks.

Unfortunately, current robotic simulation techniques on common computers have the drawbacks of being cumbersome and of requiring workarounds, of introducing simulation errors, and/or of not providing realistic and high-performing simulations.

Improved techniques are therefore desirable.

SUMMARY OF THE DISCLOSURE

Various disclosed embodiments include methods, systems, and computer readable mediums for facilitating a concurrent simulation of multiple tasks of a plurality of robots in a virtual environment, wherein at least one virtual robot is foreseen to concurrently simulate one robotic motion task and a set of robotic logic tasks by concurrently executing one corresponding robotic motion program and a set of corresponding robotic logic programs on a set of operands. A method includes, during a concurrent execution of the plurality of robotic motion programs and the plurality of sets of robotic logic programs of the plurality of robots, suspending and resuming the execution of at least one given logic program by repetitively performing the following: executing a run of the given logic program; collecting a subset of operands used in the executed run; if none of the collected operands is modified in the execution run, suspending the execution of the given logic program and resuming its execution when one of the collected operands is modified.

The foregoing has outlined rather broadly the features and technical advantages of the present disclosure so that those skilled in the art may better understand the detailed description that follows. Additional features and advantages of the disclosure will be described hereinafter that form the subject of the claims. Those skilled in the art will appreciate that they may readily use the conception and the specific embodiment disclosed as a basis for modifying or designing other structures for carrying out the same purposes of the present disclosure. Those skilled in the art will also realize that such equivalent constructions do not depart from the spirit and scope of the disclosure in its broadest form.

Before undertaking the DETAILED DESCRIPTION below, it may be advantageous to set forth definitions of certain words or phrases used throughout this patent document: the terms "include" and "comprise," as well as derivatives thereof, mean inclusion without limitation; the term "or" is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, whether such a device is implemented in hardware, firmware, software or some combination of at least two of the same. It should be noted that the functionality associated with any particular controller may be centralized or distributed, whether locally or remotely. Definitions for certain words and phrases are provided throughout this patent document, and those of ordinary skill in the art will understand that such definitions apply in many, if not most, instances to prior as well as future uses of such defined words and phrases. While some terms may include a wide variety of embodiments, the appended claims may expressly limit these terms to specific embodiments.

BRIEF DESCRIPTION OF THE DRAWINGS

For a more complete understanding of the present disclosure, and the advantages thereof, reference is now made to the following descriptions taken in conjunction with the accompanying drawings, wherein like numbers designate like objects, and in which:

FIG. 2 illustrates a screenshot of an example of robot program viewer;

FIG. 4 illustrates a sequence diagram of an example of concurrent simulation of multiple robotic tasks of a robot in accordance with disclosed embodiments;

DETAILED DESCRIPTION

FIGS. 1 through 5, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged device. The numerous innovative teachings of the present application will be described with reference to exemplary non-limiting embodiments.

Previous techniques for facilitating a concurrent simulation of multiple robot tasks have performance drawbacks on common computers. The embodiments disclosed herein provide numerous technical benefits, including but not limited to the following examples.

With embodiments, a virtual simulation system running on a common computer is empowered to concurrently simulate multiple robotic tasks of a plurality of robots with acceptable performances.

With embodiments, a virtual simulation system is enabled to realistically simulate the multiple robotic tasks of a plurality of robots in an industrial cell with close to real-time performances.

With embodiments, a virtual simulation system is facilitated to concurrently execute multiple robotic programs written in their own original native codes with acceptable real-time performances.

Embodiments save CPU time in case of robotic simulations of several concurrent robotic logic programs.

With embodiments, a realistic virtual commissioning simulation is enabled to run on a robotic simulation platform, like e.g. Process Simulate of Siemens Corporation, departing from robotic programs written in their original native coding language.

Embodiments provide encapsulation properties by enabling the whole simulation to run on a simulation platform like Process Simulate without requiring additional-external VRC connections.

Figure 1:
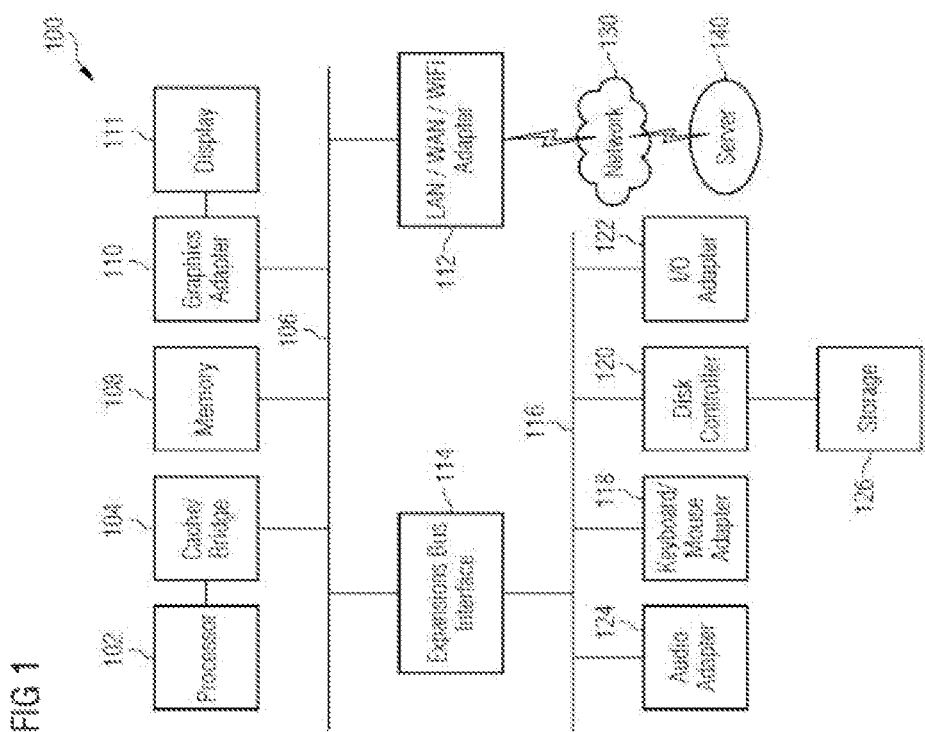
FIG. 1 illustrates a block diagram of a data processing system in which an embodiment can be implemented.

FIG. 1 illustrates a block diagram of a data processing system 100 in which an embodiment can be implemented, for example as a PDM system particularly configured by software or otherwise to perform the processes as described herein, and in particular as each one of a plurality of interconnected and communicating systems as described herein. The data processing system 100 illustrated can include a processor 102 connected to a level two cache/bridge 104, which is connected in turn to a local system bus 106. Local system bus 106 may be, for example, a peripheral component interconnect (PCI) architecture bus. Also connected to local system bus in the illustrated example are a main memory 108 and a graphics adapter 110. The graphics adapter 110 may be connected to display 111.

Other peripherals, such as local area network (LAN)/Wide Area Network/Wireless (e.g. WiFi) adapter 112, may also be connected to local system bus 106. Expansion bus interface 114 connects local system bus 106 to input/output (I/O) bus 116. I/O bus 116 is connected to keyboard/mouse adapter 118, disk controller 120, and I/O adapter 122. Disk controller 120 can be connected to a storage 126, which can be any suitable machine usable or machine readable storage medium, including but are not limited to nonvolatile, hardcoded type mediums such as read only memories (ROMs) or erasable, electrically programmable read only memories (EEPROMs), magnetic tape storage, and user-recordable type mediums such as floppy disks, hard disk drives and compact disk read only memories (CD-ROMs) or digital versatile disks (DVDs), and other known optical, electrical, or magnetic storage devices.

Also connected to I/O bus 116 in the example shown is audio adapter 124, to which speakers (not shown) may be connected for playing sounds. Keyboard/mouse adapter 118 provides a connection for a pointing device (not shown), such as a mouse, trackball, trackpointer, touchscreen, etc.

Those of ordinary skill in the art will appreciate that the hardware illustrated in FIG. 1 may vary for particular implementations. For example, other peripheral devices, such as an optical disk drive and the like, also may be used in addition or in place of the hardware illustrated. The illustrated example is provided for the purpose of explanation only and is not meant to imply architectural limitations with respect to the present disclosure.

A data processing system in accordance with an embodiment of the present disclosure can include an operating system employing a graphical user interface. The operating system permits multiple display windows to be presented in the graphical user interface simultaneously, with each display window providing an interface to a different application or to a different instance of the same application. A cursor in the graphical user interface may be manipulated by a user through the pointing device. The position of the cursor may be changed and/or an event, such as clicking a mouse button, generated to actuate a desired response.

One of various commercial operating systems, such as a version of Microsoft Windows™, a product of Microsoft Corporation located in Redmond, Wash. may be employed if suitably modified. The operating system is modified or created in accordance with the present disclosure as described.

LAN/WAN/Wireless adapter 112 can be connected to a network 130 (not a part of data processing system 100), which can be any public or private data processing system network or combination of networks, as known to those of skill in the art, including the Internet. Data processing system 100 can communicate over network 130 with server system 140, which is also not part of data processing system 100, but can be implemented, for example, as a separate data processing system 100.

In an exemplary embodiment, the main algorithm steps for facilitating a concurrent simulation of multiple tasks of a plurality of robots in a virtual environment are illustrated below.

Assume for illustration purposes that this exemplary embodiment refers to a simulation scenario (not shown) of an industrial cell with a plurality of 30 industrial robots $R_i$, each robot foreseen to concurrently execute different tasks consisting of a single motion task $MT_i$ and a set of 20 logic tasks $LT_{i,j}$, where i=1, ..., 30 and j=1, ..., 20. The concurrent simulation of the multiple tasks of the 30 robots is performed by concurrently executing the corresponding 30 robotic motion programs and the 600 logic programs of the robots on sets of operands.

With embodiments, it is provided a software tool for automatic deciding, during simulation, when a robotic logic program has no real impact on the overall simulation and can therefore be suspended until a relevant impacting condition takes place. The automatic software tool decision is a prediction based on an analysis of robot programs and on a simulation of robotic events where used operands relating to existing robotic signals, parameters and/or variables are taken into account.

The concurrent simulation of the multiple 630 robotic tasks is facilitated, during a concurrent and continuous execution of the corresponding 630 robotic programs, by suspending and resuming the execution of one or more given logic programs by performing the following sub-steps:

1) executing a run of the given logic program;
2) collecting a subset of operands used in the executed run;
3) if none of the collected operands is modified in the execution run, suspending the execution of the given logic program and resuming the program execution when one the collected operands is modified and going to sub-step 4);
4) going back to sub-step 1).

Figure 3A:
FIG. 3 illustrates a screenshot of exemplary viewers of robotic parameters and of robot signals.

FIG. 2 illustrates a screenshot of an example of robot program viewer and FIG. 3 illustrates a screenshot of examples of viewers of robotic parameters and of robot signals. The screenshots of FIGS. 2 and 3 illustrate examples of instructions of robotic logic and motion programs and examples of operands typically involved in robotic programs. In fact, each robotic logic program can be seen as a container of logic instructions on operands. In computer programming, an operand is a term used to describe any object that is capable of being manipulated. Examples of operands in robotic programs include, but are not limited by, robotic variables, robotic parameters and robotic signals. It is noted that even if a specific robotic logic task $LT_{h,k}$ of a robot $R_h$ does not comprise any kinematic operation, the execution of this specific logic task $LT_{h,k}$ may still impact the kinematic operations of the robot $R_h$. For example, this robotic logic task execution may be an ongoing check on a human-movement tracking sensor, which, upon a certain sensor input, may cause the activation of a robot's safety stop due to a detected human presence. This interdependence between robotic logic tasks and robotic motion tasks may for example be obtained by having, within a specific robot logic program, an instruction modifying a value of an operand which in turn causes the execution of a robotic kinematic instruction in the motion robotic program.

An example of such interdependent interaction is illustrated in FIG. 2 where an example screenshot 200 of a program viewer is shown. On the left window 201, logic instructions of an example of code of robotic logic program "INIT_Markers" for marker initialization are shown. On the right window 202, it is shown a code portion of an example of robotic motion program "Main" containing logic instructions and a kinematic instruction "CALL PRODUCTION START" at line 17. As shown in FIG. 2, the logic task 201 has an impact 203 on the execution of robotic motion task 202, specifically when, during the logic program execution, operand RO[2] is set to "ON", the execution of the robotic motion program is then moved forward "WAIT RO[2]= ON".

It is noted that several combinations of interdependent interactions may conveniently be foreseen among the different multiple robotic tasks. For example, during execution, a logic task $LT_{3,4}$ of robot $R_3$ may have an impact, through a PLC, on the logic task $LT_{7,2}$ of robot $R_7$ which in turn may have an impact on the motion task $MT_7$ of the same robot $R_7$. In another example, during execution, the motion task $MT_8$ of robot $R_8$ may have an impact, through a PLC, on the motion task $MT_{20}$ of robot $R_{20}$ which in turn may have an impact, through a PLC, on the logic task $LT_{18,2}$ of robot $R_{18}$.

The multiple robotic tasks $MT_i$, $LT_{i,j}$ of the same robot $R_i$ interact with each other via relevant changes of operand values of the robot $R_i$ during the concurrent executions of the corresponding multiple robotic programs as it will be illustrated in the exemplary embodiment referring to FIG. 4.

It is noted that in virtual commissioning, for real simulation validations, users connect PLCs synchronizing the robots so that the PLCs impact the overall simulation results via their signals exchanges. Each robot input signal of any robots is connected to the PLC, which according to his PLC code retrieves back output signals to the robots.

FIG. 3 illustrates a screenshot 300 of exemplary viewers 301, 302 of robotic parameters and of robot signals.

In the robotic parameter viewer 301, are shown robotic parameters which can be local ones, e.g. inside a single running program only, or global ones, e.g. across different robotic program of the same robot.

In the robotic signal viewer 302, are shown signal data which can be exchanged outside among robots, via PLCs, and which can be used for internal usage of a robot.

FIG. 4 illustrates a sequence diagram of an example of concurrent simulation of multiple robotic tasks of a robot in accordance with disclosed embodiments.

In the sequence diagram of FIG. 4, an embodiment example of concurrent simulation over time—along the x axis—of one robotic motion task 411 and two robotic logic tasks 412, 413 are shown.

The dashed segment 401 within the continuous line of the logic task 412 illustrates that, during the corresponding time interval $t_2$-$t_3$, the execution of the corresponding logic program is suspended, e.g. via a sleep mode, and resumed then when a value change on a relevant operand occurs e.g. via a wake up event 429. For the other robotic tasks 412, 413 the system invokes no sleep mode and the corresponding lines are therefore depicted as continuous.

In the initially depicted time interval, until time $t_1$, the system concurrently runs the execution of all three programs without any suspension. It is noted that along all the depicted time frame, the robotic program of the motion task 411 is executed all the time, as in a regular simulation, without any suspension, while the robotic program of the logic task 413 may be suspended on a later time stage (not shown) if certain conditions according to embodiments occur.

During the program executions of these three robotic tasks 411, 412, 413, there are communication exchanges 421, . . . , 428 with operands container 402, comprising the set of all operands relevant for all robotic programs of this specific robot.

Examples of communication exchanges include, but are not limited by, reading operand values, modifying operand values, registering and deregister on event occurring on an operand, actions on operand value changes and other exchanges with the set of all operands in operands container 402. For the two robotic logic tasks 412, 413, during each program execution run, used operands are collected and it is checked whether they are modified during the execution run, whereby an operand may be modified by the logic program itself, by another program of the same specific robot or by external impact, e.g. a signal from the PLC.

In the time interval $t_1$-$t_2$, it is found that, for task 411, there are no changes to the subset of used operand during the program execution run, therefore the system puts the program into a sleep mode 401, registers 428 to a change to the subset of used operand and wakes the program 429 to run again from sleep mode on an event 430 of change to at least one of the operands and deregisters the subset of used operands.

The exemplary embodiments disclosed herein refers to one robotic motion task and two robotic logic tasks of the same robot. In other embodiments, more robotic motion programs and more robotic logic tasks may be contemplated for the plurality of robots.

In another exemplary embodiment, an algorithm comprises the following exemplary main steps: during the full simulation of all motion and logic programs (where in FIG. 4 only three of them are shown), for each given logic program, a data processing system collects the subset of used operands $O_j$ which are involved in this simulation execution run $S_j$, when no changes to any of the operand values occurs, the system registers to a change of one of the operands of the subset $O_j$ and puts this given logic program into sleep mode 401 until there is an event 430 that changes one of the operands of the subset $O_j$, then the system wakes up this given logic program and deregisters all the operands of the susbset $O_j$. The steps for checking the operand conditions regarding if and when a logic program can be put to sleep and the consequent actions to be undertaken are ongoingly repeated by the system during the full concurrent and continuous simulation. In this embodiment, the system executes again the given logic program in a new simulation execution run $S_k$, it collects the new subset of used operands $O_k$ relevant for this new simulation run $S_k$, and then, upon need, performs again the sleeping and de/registration actions (not shown) as previously outlined.

It is noted that for each same logic program, in every different simulation execution run $S_j$, $S_k$, other used operand subsets $O_j$, $O_k$ may be collected since "which" operand subset is used in a specific simulation run $S_h$ may depend also on other surrounding conditions of the full simulation. Hence, an a-priori analysis of the logic program codes, without the execution of the full simulation, would be inadequate for providing correct information on the relevant used operand subsets $O_j$, $O_k$ for each specific simulation execution run $S_j$, $S_k$.

An example clarifying the determination of different used operand subsets is provided in Table 1 below.

TABLE 1 an example of logic program and of different collected operand subsets.

```
//Logic Program Pseudocode LPP example
RI[1]=DI[20] + DI[21] + DI[22];
IF (RI[1] > 20)
{
    DO[48] = (DI[1] AND DI[2]) OR DI[3] OR DI[4] OR DI[5];
}
ELSE
{
    DO[48] = FALSE;
}
//Execution run values of Case_1
DI[20] = 5           DI[21] = 5           DI[22] = 5
DI[1] = TRUE         DI[2] = TRUE         DI[3] = TRUE
DI[4] = TRUE         DI[5] = TRUE         RI[1] = 0
// → RI[1]=15 → ELSE CASE →
Operands in use for LLP: DI[20], DI[21], DI[22], RI[1], DO[48]
(Operands not in use for LLP: DI[1], DI[2], DI[3], DI[4], DI[5])
// Execution run values of Case_2
DI[20] = 5           DI[21] = 10          DI[22] = 30
DI[1] = TRUE         DI[2] = TRUE         DI[3] = TRUE
DI[4] = TRUE         DI[5] = TRUE         RI[1] = 0
//→ RI[1]=45 → IF CASE →
Operands in use for LLP:
DI[20], DI[21], DI[22], RI[1], DO[48], DI[1], DI[2]
(Operands not in use for LLP: DI[3], DI[4], DI[5])
```

Table 1 comprises an example of pseudo-code of a logic program LPP whereby, during simulation, two different subsets of used operands are collected: in the first case, when the "ELSE" condition is met, the collected used operand subset is {DI[20], DI[21], DI[22], RI[1], DO[48]} and in the second case, when the "IF" condition is met, the collected used operand subset is {DI[20], DI[21], DI[48], RI[1], DO[48], DI[1], DI[2]}.

In fact, during the simulation execution run of the first case, the used operand subset does not include the operands DI[3], DI[4], DI[5] because the "END" operation (DI[1] AND DI[2]) returns a "TRUE" result, and therefore there is no need to deal with the remaining operands DI[3], DI[4], DI[5] of an "OR operation" which are therefore unused operands.

In another exemplary embodiment, the main algorithm steps for facilitating a concurrent simulation of multiple tasks of a plurality of robots in a virtual environment are illustrated below. Assume there is a plurality of robots each one foreseen to run one robotic motion program and a set of robotic logic programs.

During the full simulation, the system executes the program of each robotic motion task as usual without any change. For each robotic logic task, the system will continuously run the following loop during the full simulation:
 L1) execute the robotic logic task once;
 L2) during its simulation, collect all the operands which are used;
 L3) during its simulation, check if any of all used operands is changed;
 L4) if no used operand is changed:
  L4.1) register to each used operand of item L2)

L4.2) put the logic program to sleep mode;
L4.3) wake up the logic program when occurs any event due to a value change of one of the registered operands;
L4.4) unregister to each operand of item L2
L4.5) go to L1).

In embodiments, for logic programs comprising a large amount of instructions to be executed, the number of executed instructions in each simulation execution time interval may be advantageously be reduced by applying one or any combination of the following constraints:
executing a predefined maximal number of instructions;
assigning a predefined maximal CPU time interval;
dynamically balancing based on the load of the other logical programs under execution.

An example of pseudo-code for implementing the main steps of an embodiment algorithm is shown in Table 2 below.

TABLE 2 pseudo-code of an embodiment algorithm main steps.

```
Static List <operands> OperandsInUse = new List <operands>( );
Void ExecuteLogicTask(TaskNumber)
{
  Bool isAnyOperandWasSet = false;
  For each loop on all Instructions of Task[TaskNumber]
  {
    OperandsInUse.AddRange(ExtractOperandsFromNextInstruction
    ( ));
    ExecuteNextInstruction( );
    If(isAnyOperandWasSet==false)
    {
    isAnyOperandWasSet =
    IsAnyOperandSetByNextInstruction( ) ;
    }
  }
  If(isAnyOperandWasSet==true)
  {
    RegisterToSetValue(OperandsInUse, WakeUpEvent)
    Task.Sleep( )
  }
}
Event WakeUpEvent( )
{
  UnRegisterToSetValue(OperandsInUse)
  OperandsInUse.Clear( )
  Task.WakeUp ( )
}
```

The pseudocode in Table 2 refers to the following main steps of an algorithm of an exemplary embodiment: collecting used operands of a logic task, checking whether the collected used operand are modified and, if not, setting the logic task to sleep by registering to the used operand subset for calling a wake up event.

Therefore, embodiments advantageously provide an automatic tool that, based both on analysis of robotic program with their operands and on robotic simulation of events, is capable of deciding during simulation when/which robotic logic programs does not have a real impact within the full robotic simulation so that that such robotic logic programs can be put to sleep and be awaken only when a modification of a used operand value occurs.

The execution of a suspended logic program is restored when a change of value of one of its used operands occurs.

In embodiments, the execution of the suspended logic program may be triggered by using several different implementation options for detecting a value change on one of the used operands. Examples include, but are not limited by, one or more of the following implementation options:

a single event for each single used operand of the subset;
a single event for all used operands of the subset;
going over all operands of the subset and checking whether any of their values has changed
having a dirty bit for denoting when an operand value is changed, turning on the dirty bit which is the gate for deciding whether to resume or not the execution of the suspended logic task.

In embodiments, the code of one or more of the logic programs is written in a native language of a corresponding physical robot.

Embodiments may advantageously be applied on multiple core, multiple-thread and/or multiple processes architecture.

Embodiments may be implemented through different types of system configurations. Examples of system configurations include, but are not limited by, a system configuration based on a single simulation module executing all the robotic programs to provide a full simulation and a system configuration comprising two distinct simulation modules interacting with each other to provide a full simulation. In case of a configuration with two distinct simulation modules, the two distinct modules are a robotic kinematic simulation module for executing all the robotic motion programs as they are and a robotic logic simulation module for executing all the robotic logic tasks in an optimized manner with execution suspensions as taught by embodiments. In other embodiments, hybrid configuration may be contemplated, for example where execution optimizations are performed only for a selected subset of the all logic programs.

Figure 5:
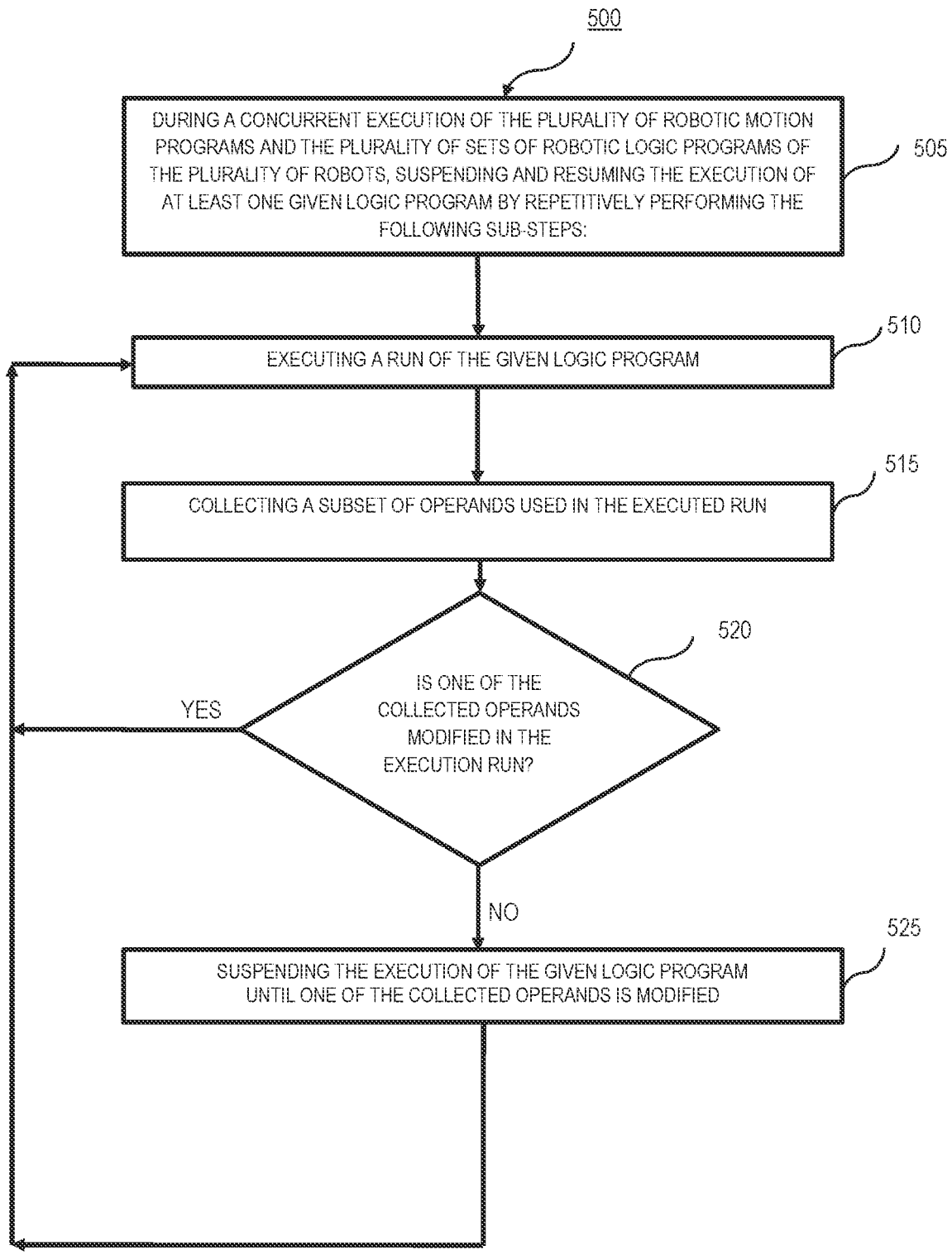
FIG. 5 illustrates a flowchart for facilitating a concurrent simulation of multiple tasks of a plurality of robots in a virtual environment in accordance with disclosed embodiments.

FIG. 5 illustrates a flowchart 500 of a method for facilitating a concurrent simulation of multiple tasks of a plurality of robots in a virtual environment in accordance with disclosed embodiments. Such method can be performed, for example, by system 100 of FIG. 1 described above, but the "system" in the process below can be any apparatus configured to perform a process as described.

In the virtual environment, at least one robot of the plurality of robots is foreseen to concurrently simulate one robotic motion task and a set of robotic logic tasks by concurrently executing one corresponding robotic motion program and a set of corresponding robotic logic programs on a set of operands.

At act 505, during a concurrent execution of the plurality of robotic motion programs and the plurality of sets of robotic logic programs of the plurality of robots, suspending and resuming the execution of at least one given logic program by repetitively performing the actions of acts 510-525.

At act 510, a run of the given logic program is executed.

At act 515, a subset of operands used in the executed run is collected.

At act 520, it is checked whether one of the collected operands is modified in the execution run.

At act 525, the execution of the given logic program is suspended until one of the collected operands is modified.

In embodiments, a trigger for resuming a suspended logic program execution may advantageously be selected from the group consisting of:

a single event of value change for each single used operand of the subset;
a single event of value change for all used operands of the subset;
a check to detect a value change for each used operand of the subset;
a change on a dirty bit defining an operand value change;

any other implementation for detecting a modification of one of the operands of the used operand subset.

In embodiments, the suspending and resuming of execution of the given logic program may conveniently be performed by the following steps:

registering to an event on the collected operand subset;
putting the given logic program into a sleep mode;
if an event on a registered operand occurs, waking the given logic program up from the sleep mode;
deregistering the subset of registered operands.

An embodiment of a method for facilitating, by a data processing system, a concurrent simulation of multiple tasks of a plurality of robots in a virtual environment, wherein at least one virtual robot is foreseen to concurrently simulate one robotic motion task and a set of robotic logic tasks by concurrently executing one corresponding robotic motion program and a set of corresponding robotic logic programs on a set of operands, comprises the following step: during a concurrent execution of the plurality of robotic motion programs and the plurality of sets of robotic logic programs of the plurality of robots, suspending and resuming the execution of at least one given logic program by repetitively performing the following sub-steps:

1) executing a run of the given logic program;
2) collecting a subset of operands used in the executed run;
3) if none of the collected operands is modified in the execution run, suspending the execution of the given logic program and resuming its execution when one of the collected operands is modified.

Of course, those of skill in the art will recognize that, unless specifically indicated or required by the sequence of operations, certain steps in the processes described above may be omitted, performed concurrently or sequentially, or performed in a different order.

Those skilled in the art will recognize that, for simplicity and clarity, the full structure and operation of all data processing systems suitable for use with the present disclosure is not being illustrated or described herein. Instead, only so much of a data processing system as is unique to the present disclosure or necessary for an understanding of the present disclosure is illustrated and described. The remainder of the construction and operation of data processing system 100 may conform to any of the various current implementations and practices known in the art.

It is important to note that while the disclosure includes a description in the context of a fully functional system, those skilled in the art will appreciate that at least portions of the present disclosure are capable of being distributed in the form of instructions contained within a machine-usable, computer-usable, or computer-readable medium in any of a variety of forms, and that the present disclosure applies equally regardless of the particular type of instruction or signal bearing medium or storage medium utilized to actually carry out the distribution. Examples of machine usable/readable or computer usable/readable mediums include: nonvolatile, hard-coded type mediums such as read only memories (ROMs) or erasable, electrically programmable read only memories (EEPROMs), and user-recordable type mediums such as floppy disks, hard disk drives and compact disk read only memories (CD-ROMs) or digital versatile disks (DVDs).

Although an exemplary embodiment of the present disclosure has been described in detail, those skilled in the art will understand that various changes, substitutions, variations, and improvements disclosed herein may be made without departing from the spirit and scope of the disclosure in its broadest form.

None of the description in the present application should be read as implying that any particular element, step, or function is an essential element which must be included in the claim scope: the scope of patented subject matter is defined only by the allowed claims.

What is claimed is:

1. A method, to be performed by a data processing system, of concurrently simulating multiple tasks of a plurality of robots in a virtual environment, wherein at least one virtual robot is foreseen to concurrently simulate one robotic motion task and a set of robotic logic tasks by concurrently executing one corresponding robotic motion program and a set of corresponding robotic logic programs on a set of operands, the method comprising the following step:

during a concurrent execution of the plurality of robotic motion programs and the plurality of sets of robotic logic programs of the plurality of robots, selectively suspending and resuming an execution of at least one given logic program by repeatedly performing the following sub-steps:
a) executing a run of a given logic program;
b) collecting a subset of operands used in the run executed in sub-step a);
c) if none of the collected operands is modified in the execution run, suspending an execution of the given logic program and resuming the execution of the given logic program when one of the collected operands is modified.

2. The method according to claim 1, wherein a trigger for resuming a suspended logic program execution is a trigger selected from the group consisting of:

a single event of a value change for each single used operand of the subset;
a single event of a value change for all used operands of the subset;
a check to detect a value change for each used operand of the subset;
a change on a dirty bit defining an operand value change; and
any other implementation for detecting a modification of one of the operands of the used operand subset.

3. The method according to claim 1, wherein the steps of suspending and resuming the execution of the given logic program of sub-step c) comprise the following:

registering to an event on the collected operand subset;
putting the given logic program into a sleep mode;
if an event on a registered operand occurs, waking the given logic program up from the sleep mode; and
deregistering the subset of registered operands.

4. A data processing system for concurrently simulating multiple tasks of a plurality of robots in a virtual environment, wherein at least one virtual robot is foreseen to concurrently simulate one robotic motion task and a set of robotic logic tasks by concurrently executing one corresponding robotic motion program and a set of corresponding robotic logic programs on a set of operands, the data processing system comprising:

a processor; and
an accessible memory; and
wherein the data processing system is configured to:
during a concurrent execution of the plurality of robotic motion programs and the plurality of sets of robotic logic programs of the plurality of robots, selectively suspending and resuming the execution of at least one given logic program by repetitively performing the following sub-steps:

a) executing a run of the given logic program;
b) collecting a subset of operands used in the execution run of sub-step a);
c) if none of the collected operands is modified in the execution run, suspending the execution of the given logic program and resuming the execution of the given logic program when one of the collected operands is modified.

5. The data processing system of claim 4, wherein a trigger for resuming a suspended logic program execution is a trigger selected from the group consisting of:

a single event of a value change for each single used operand of the subset;
a single event of a value change for all used operands of the subset;
a check to detect a value change for each used operand of the subset;
a change on a dirty bit defining an operand value change; and
any other implementation for detecting a modification of one of the operands of the used operand subset.

6. The data processing system according to claim 4, configured to selectively suspend and resume the execution of the given logic program of sub-step c) comprise the following:

registering to an event on the collected operand subset;
putting the given logic program into a sleep mode;
if an event on a registered operand occurs, waking the given logic program up from the sleep mode; and
deregistering the subset of registered operands.

7. A non-transitory computer-readable medium encoded with executable instructions that, when executed, cause one or more data processing systems to:

concurrently simulate multiple tasks of a plurality of robots in a virtual environment, wherein at least one virtual robot is foreseen to concurrently simulate one robotic motion task and a set of robotic logic tasks by concurrently executing one corresponding robotic motion program and a set of corresponding robotic logic programs on a set of operands;

during a concurrent execution of a plurality of robotic motion programs and a plurality of sets of robotic logic programs of the plurality of robots, suspend and resume the execution of at least one given logic program by repetitively performing the following:

a) executing a run of the given logic program;
b) collecting a subset of operands used in the executed run;
c) if none of the collected operands is modified in the execution run, suspending the execution of the given logic program and resuming its execution when one of the collected operands is modified.

8. The non-transitory computer-readable medium according to claim 7, wherein a trigger for resuming a suspended logic program execution is selected from the group consisting of:

a single event of a value change for each single used operand of the subset;
a single event of a value change for all used operands of the subset;
a check to detect a value change for each used operand of the subset;
a change on a dirty bit defining an operand value change; and
any other implementation for detecting a modification of one of the operands of the used operand subset.

9. The non-transitory computer-readable medium according to claim 7, wherein the execution of the given logic program is suspended and resumed by:

registering to an event on the collected operand subset;
putting the given logic program into a sleep mode;
if an event on a registered operand occurs, waking the given logic program up from the sleep mode; and
deregistering the subset of registered operands.

* * * * *